(12) United States Patent
Mori

(10) Patent No.: US 6,259,150 B1
(45) Date of Patent: Jul. 10, 2001

(54) VOLTAGE DIVIDING RESISTOR AND VOLTAGE DIVIDING CIRCUIT

(75) Inventor: Haruya Mori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/212,244

(22) Filed: Dec. 16, 1998

(30) Foreign Application Priority Data

Jan. 27, 1998 (JP) .................................................. 10-014012

(51) Int. Cl.[7] .................................................... H01L 29/00
(52) U.S. Cl. ........................ 257/536; 257/533; 257/538
(58) Field of Search .................................... 257/536, 537, 257/538, 533, 532

(56) References Cited

U.S. PATENT DOCUMENTS

| | | | |
|---|---|---|---|
| 4,745,450 | * | 5/1988 | Hartranft et al. .................. 357/23.13 |
| 4,845,462 | * | 7/1989 | Van De Grift et al. ............. 338/323 |
| 5,600,176 | * | 2/1997 | Bucksch ................. 257/536 |

FOREIGN PATENT DOCUMENTS

| 62-266861 | * | 11/1987 | (JP) . |
| 05022137A | | 1/1993 | (JP) . |

OTHER PUBLICATIONS

Grove, A.S., Physics and Technology of Semiconductor Devices, John Wiley & Sons, 1967, p321.*
Wolf, S., Silicon Processing for the VLSI Era, vol. 2, Lattice Press, 1990, pp 194–95, 273–76.*

* cited by examiner

*Primary Examiner*—Sara Crane

(57) ABSTRACT

There is a voltage dividing circuit having a voltage dividing resistor for generating reference voltages for A/D conversion. The voltage dividing resistor further comprises a semiconductor element and, provided thereon, a resistance element, at least one capacity electrode and dielectric held therebetween. Each capacity electrode thereon is earthed. The voltage dividing resistor and the voltage dividing circuit are capable of lowering impedance of output terminals in a high frequency range, while avoiding an increase of a surface area of a chip, and undulation of impedances of output terminals in a high frequency range.

17 Claims, 9 Drawing Sheets

VOLTAGE DIVIDING RESISTOR AND VOLTAGE DIVIDING CIRCUIT

BACKGROUND OF THE INVENTION

1. Field of the Invention

The present invention relates to a voltage dividing resistor and a voltage dividing circuit. In particular, it relates to a voltage dividing resistor and a voltage dividing circuit which may be used in a reference voltage divider of an A/D converter.

2. Description of the Related Art

In an A/D converter, a voltage dividing circuit 30 as shown in the left side of FIG. 8 has heretofore been used to generate a group of voltages as comparative references.

In the voltage dividing circuit 30, a reference voltage 32 is divided by a voltage dividing resistor 33 provided with taps to generate comparative reference voltages at a group of necessary output terminals 37. The generated comparative reference voltages are supplied to comparators 31 and compared with an input signal from a comparison input terminal 34, and the input signal is converted into digital data.

Each of impedances of the output terminals 37 arranged as described above has a combined impedance of the resistance between the output terminal 37 and an input terminal 35 and the resistance between the output terminal 37 and an earth terminal 36 in parallel (It is noted that the voltage 32 in FIG. 8 may be regarded as a short, because the discussion is given here on high frequencies.). Accordingly, the impedance at the output terminal 37 at the ½ position of the resistance element is highest as shown in FIG. 5. When the A/D converter is in action, various noise currents flow into the output terminals 37 from the comparison input terminal 34 of the subsequent comparators 31 through a parasitic capacity of the comparators 31 or the like to cause fluctuations in voltage. Magnitude of the fluctuations is proportional to the impedance of the output terminal 37 and frequency of the signal. Accordingly, the fluctuation is largest at the output terminal 37 at the ½ position of the resistance element. Further, voltages per se, which are to serve as references in A/D conversion become more unstable as the frequency becomes higher. This creates a factor which adversely affects the effective dividing capacity of the A/D converter and creates distortion at a high frequency.

Japanese Unexamined Patent Publication No. 22137/1993 discloses an A/D converter which has wire connections improved in such a manner that a wiring for an input signal is led to a plurality of comparators so as to improve high frequency characteristics of the A/D converter. In contrast thereto, the present invention is directed to improvement of high frequency characteristics by stabilizing comparative reference voltages.

To solve the above problem, it has heretofore been practiced that a capacitive element 38 is connected to the output terminal 37 at the ½ position of the resistance element whose impedance is highest, thereby lowering the impedance in a high frequency range. In other words, the capacitive element 38 is connected to the output terminal 37 at the middle of the resistance element with a view to lowering the impedance in a high frequency range. FIG. 9 is a sectional view showing one form of the structure of the voltage dividing resistor 33 used in the circuit in FIG. 8. A silicon oxide layer 41 as insulator is provided on resistor 42 prepared by doping a p-type silicon substrate with n-type impurities. The silicon oxide layer 41 is formed with holes, and aluminum electrodes 43 are disposed therein to provide output electrodes.

Since the influx of noise currents occurs mainly through the parasitic capacity, magnitude of the noise currents is large in a high frequency range, i.e., the noise expends to a high frequency range. Accordingly, the connection of the capacitive element is an effective means to suppress fluctuations of the voltage.

However, the above-described means has a problem, in that it is necessary to allocate a large space in a chip to the capacitive element for eliminating influence of the noises, thereby leading to an increased cost of a chip. Further, the capacitive element is connected to the resistance element in a localized manner, i.e., at the one point in the middle of the resistance element. Accordingly, as shown in FIG. 6, the impedances in a high frequency range show such undesirable undulatory characteristics that the impedance at the output terminal 37 at the ½ position of the resistance element is locally minimum and those at the output terminals 37 at the ¼ and ¾ positions of the resistance element are locally maximum.

SUMMARY OF THE INVENTION

It is an object of the present invention to lower impedances of output terminals in a high frequency range while avoiding an increase in a surface area of a chip and undulation of the impedances of the output terminals in a high frequency range.

To solve the above problems, the present invention provides a voltage dividing resistor comprising:

an input terminal, a resistance element for dividing a voltage inputted from the input terminal, and a plurality of output terminals for outputting the divided voltages;

the voltage dividing resistor being provided with at least one capacity electrode, the at least one capacity electrode substantially constituting at least one capacitive element together with said resistance element.

It is preferred that the resistance element have its surface partially coated with insulator, and the output terminals be connected to output electrodes disposed in holes formed in the insulator coating and connected to the resistance element, and the capacity electrodes being so disposed in holes formed in the insulator coating as to hold, together with the resistance element, dielectric therebetween.

The resistance element may be a doped portion in the semiconductor substrate and thus it can be prepared by a semiconductor manufacturing technique.

It is preferred that the resistance element be provided on a semiconductor substrate via dielectric interposed therebetween, and the resistance element be substantially coated with insulator, and the output terminals be connected to output electrodes disposed in holes formed in the insulator coating and to the resistance element, with the semiconductor under the resistance element serving as the capacity electrode.

The semiconductor substrate under the resistance element may be provided therein with a doped island, which serves as the capacity electrode, and thus it can be prepared utilizing semiconductor manufacturing technique.

It is preferred that the dielectric be provided in a thickness smaller than that of the insulator coating, thereby obtaining a large capacity of the capacitive element.

It is preferred that the dielectric have a specific inductive capacity higher than that of the insulator, thereby obtaining a further increased capacity of the capacitive element.

According to the present invention, there is also provided a voltage dividing circuit comprising the above-mentioned voltage dividing resistor, each of the at least one capacity electrode of the voltage dividing resistor being connected to earth voltage or a low impedance quasi-earth voltage.

By the use of the resistance element as described above, which is compositely provided with the at least one capacitive element in the reference voltage dividing circuit in view of high frequencies, an area overlapping the space in which the resistance element is located can be used as a space for providing, each capacitive element. Accordingly, it is not necessary to separately make a large space for disposing each capacitive element in a chip. Consequently, increase in a chip cost is suppressed as compared with conventional means. Further, the capacitive element extends, on the capacitive elements are distributed, through the resistance element. By virtue of this, as shown in FIG. 7, no substantial undulation of impedance in a high frequency range such as that found in conventional means occurs thus, and a flat-top characteristic of impedance is attained.

In a doped resistor, resistance of the resistor (discussed here is prepared by forming a pn junction) changes depending upon a voltage applied thereto. In other words, a so-called back gate effect occurs. This causes impairment of top-flatness of comparative reference voltages. However, when the resistance element is made of a metal thin film or the like and is provided on the insulator, the problem can be avoided. Accordingly, top-flatness of the comparative reference voltages can be improved.

According to the embodiment where the capacitive element is provided by interposing the dielectric between the resistance element and the semiconductor substrate, use can be made of areas corresponding to those in which the electrodes of the insulator are located and thus which cannot be used in the other embodiments for providing capacitive elements. By virtue of this, a larger capacity can be obtained. When a material having a high specific inductive capacity is used as the dielectric in the thus constituted capacitive element, a further increased capacity can be obtained.

DESCRIPTION OF THE PREFERRED EMBODIMENTS

In the following, embodiments of the present invention will be described in detail with reference to the drawings.

Figure 1:
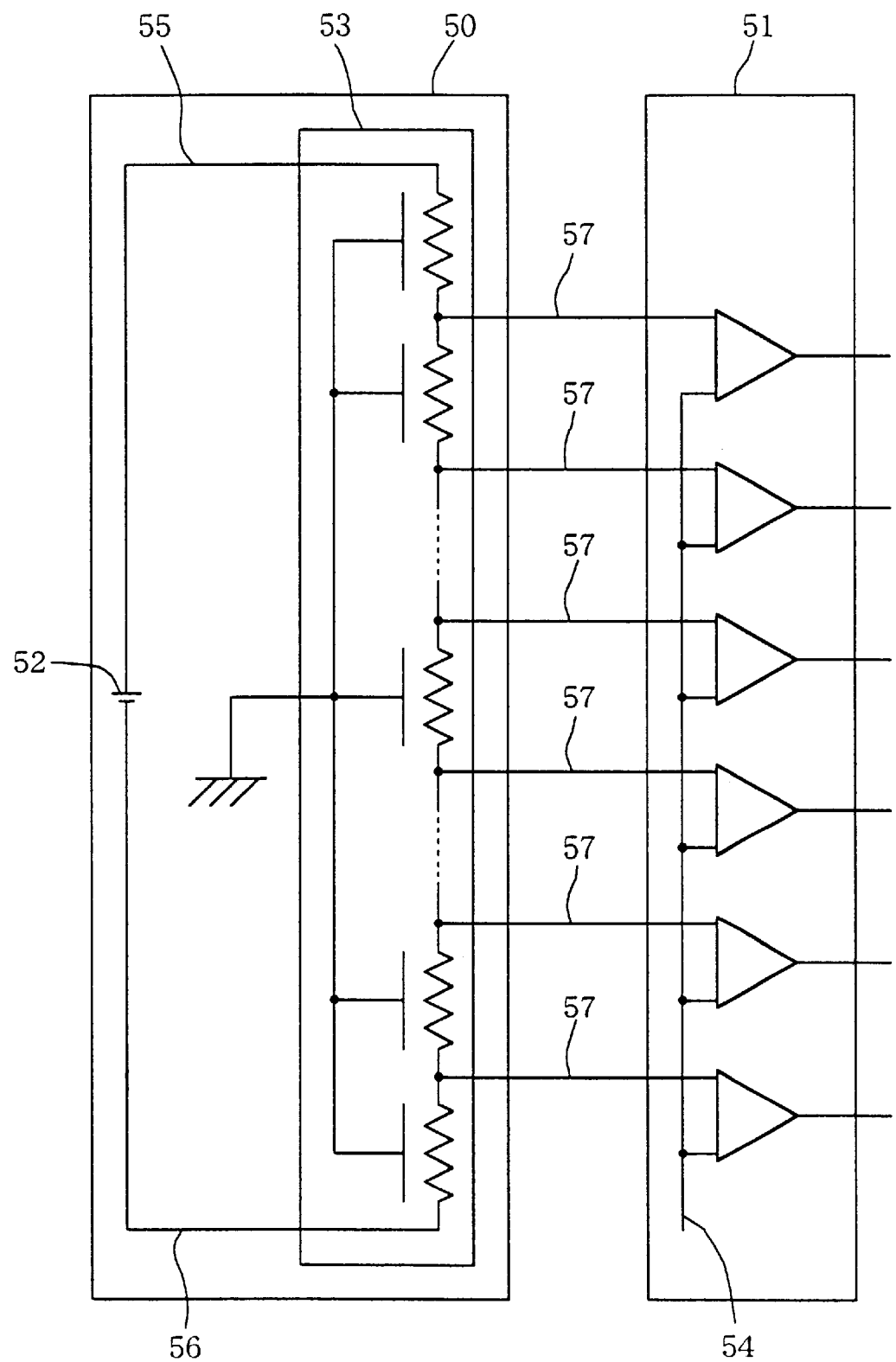
FIG. 1 is a diagram showing one form of an input section of an A/D converter using the voltage dividing circuit according to the present invention.
Figure 8:
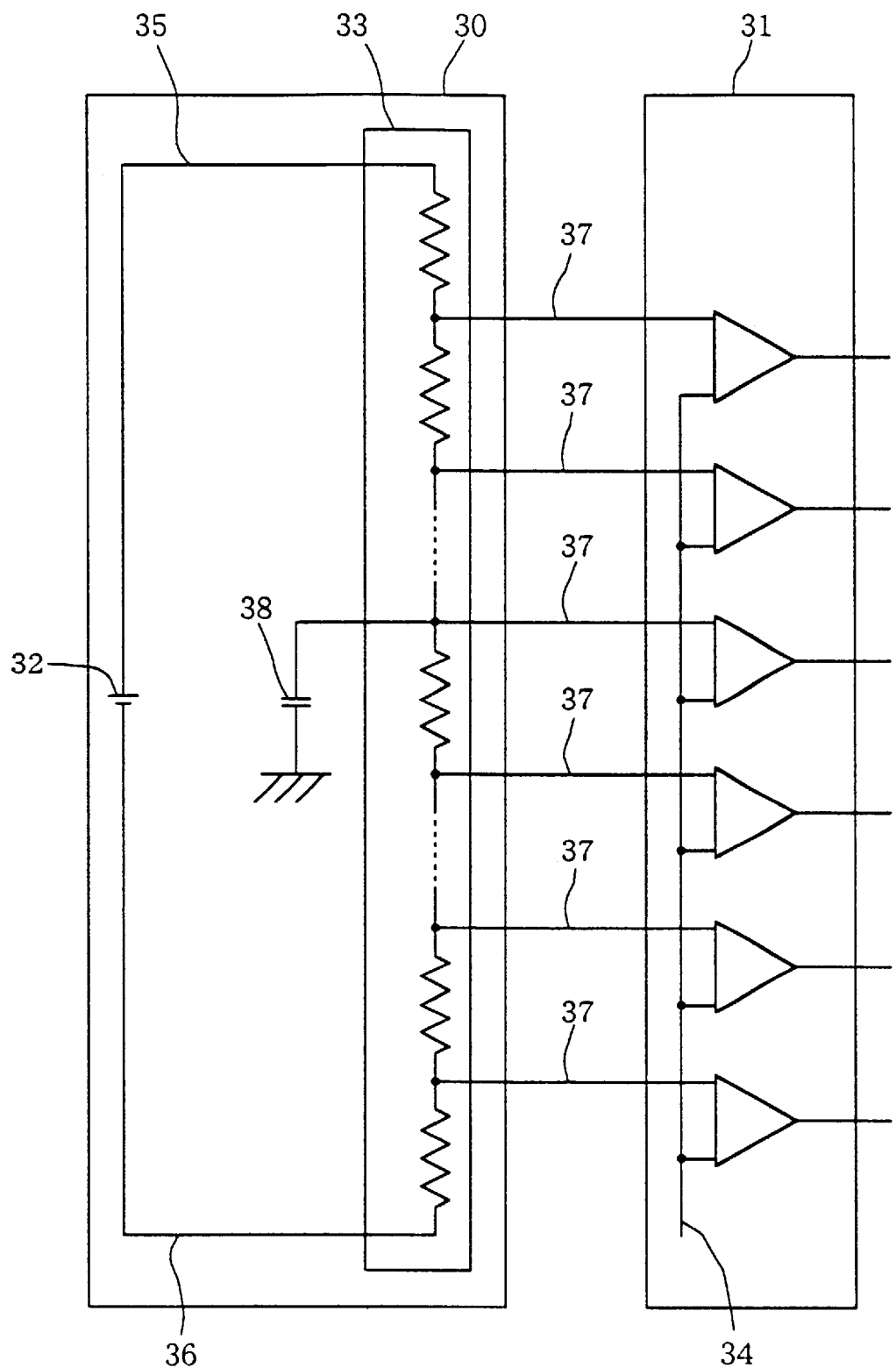
FIG. 8 is a diagram showing one form of an input section of an A/D converter using the conventional voltage dividing circuit.
Figure 9:
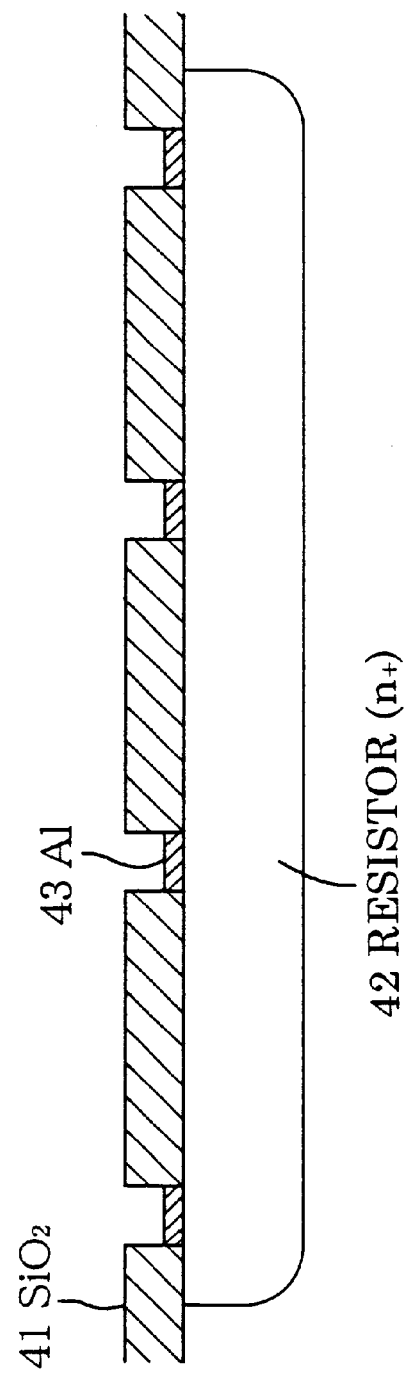
FIG. 9 is a sectional view showing one form of the structure of the resistance element of the conventional voltage dividing resistor.

FIG. 1 shows an example of a circuit diagram of an input section of an A/D converter which includes the voltage dividing circuit 50 according to the present invention. As in the A/D converter in FIG. 8, a reference voltage 52 is divided by means of a voltage dividing resistor 53 provided with an input terminal 55 and an earth terminal 56 to generate comparative reference voltages at output terminals 57. The generated comparative reference voltages are supplied to comparators 51 together with an input signal from a comparison input terminal 54.

Figure 2:
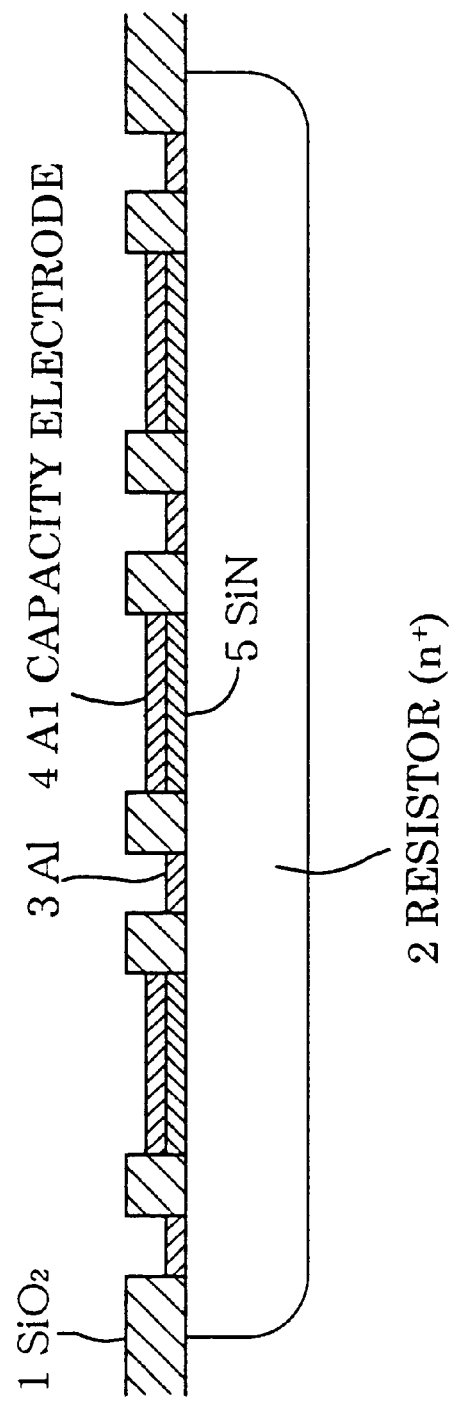
FIG. 2 is a sectional view showing a structure of the first embodiment of the voltage dividing resistor according to the present invention.

FIG. 2 is a sectional view showing a structure of the first rembodiment of the voltage dividing resistor 53 used in the circuit in FIG. 1.

As a semiconductor substrate, a p-type silicon substrate is used. The substrate has its surface coated with a silicon oxide layer as insulator 1. The semiconductor substrate is provided therein with resistor 2 prepared by doping the semiconductor substrate with n-type impurities. The resistor 2 is connected to aluminum output electrodes 3 disposed in holes formed in the insulator layer 1. Between the output electrodes 3, dielectric 5 is provided. As the dielectric 5, silicon nitride is used which has a specific inductive capacity higher than that of silicon oxide. The dielectric is provided in a thickness smaller than that of the insulator coating so as to obtain a large capacity per unit area, on the dielectric 5, aluminum electrodes are provided as capacity electrodes 4. Each of the capacity electrodes 4 is connected to the earth voltage or a low impedance quasi-earth voltage via aluminum wires.

Figure 3:
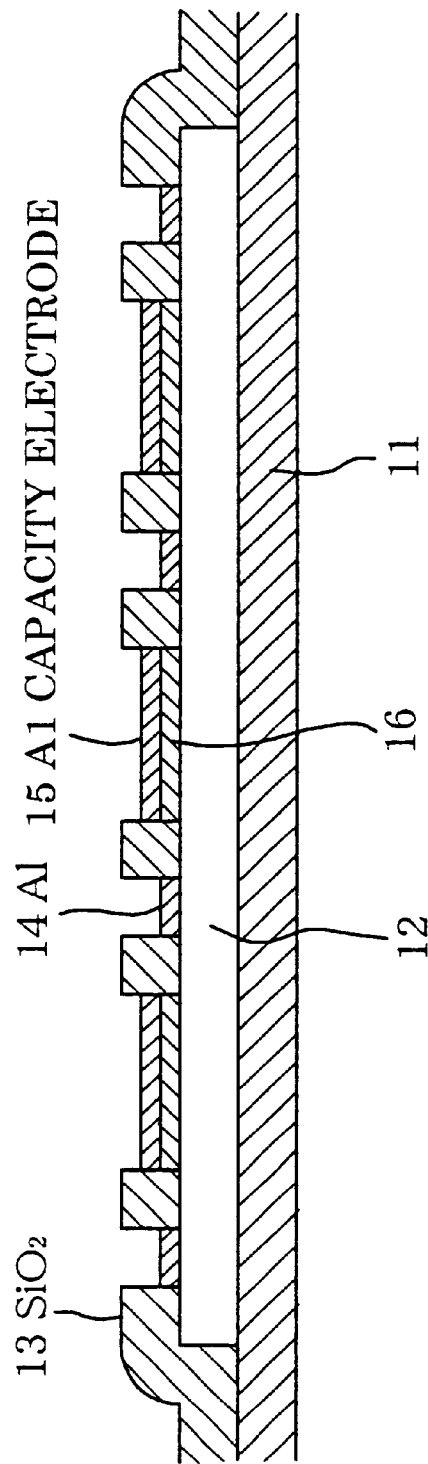
FIG. 3 is a sectional view showing a structure of the second embodiment of the voltage dividing resistor according to the present invention.

FIG. 3 shows the second embodiment of the voltage dividing resistor 53 according to the present invention, whereas the resistor 2 in the first embodiment is prepared by doping the semiconductor substrate with impurities, resistor 12 in this embodiment is an impurity-doped polycrystalline silicon thin film provided on insulator 11. As in the first embodiment, the resistor 12 is connected to aluminum output electrodes 14 disposed in holes formed in a silicon oxide coating as insulator 13. Between the output electrodes 14, dielectric 16 is provided. As the dielectric 16, silicon nitride is used. The dielectric 16 is provided in a thickness smaller than that of the insulator coating so as to obtain a large capacity per unit area. On the dielectric 16, aluminum capacity electrodes 15 are provided. Each of the capacity electrodes 15 is connected to the earth voltage or a low impedance quasi-earth voltage via aluminum wires.

Figure 4:
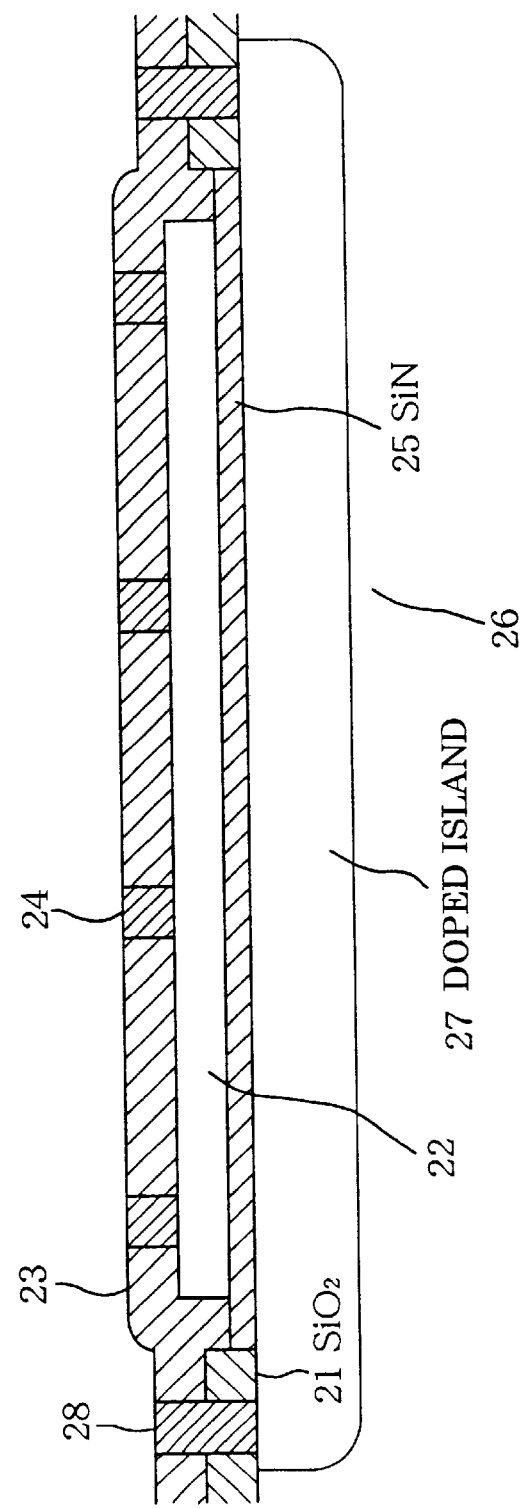
FIG. 4 is a sectional view showing a structure of the third embodiment of the voltage dividing resistor according to the present invention.
Figure 5:
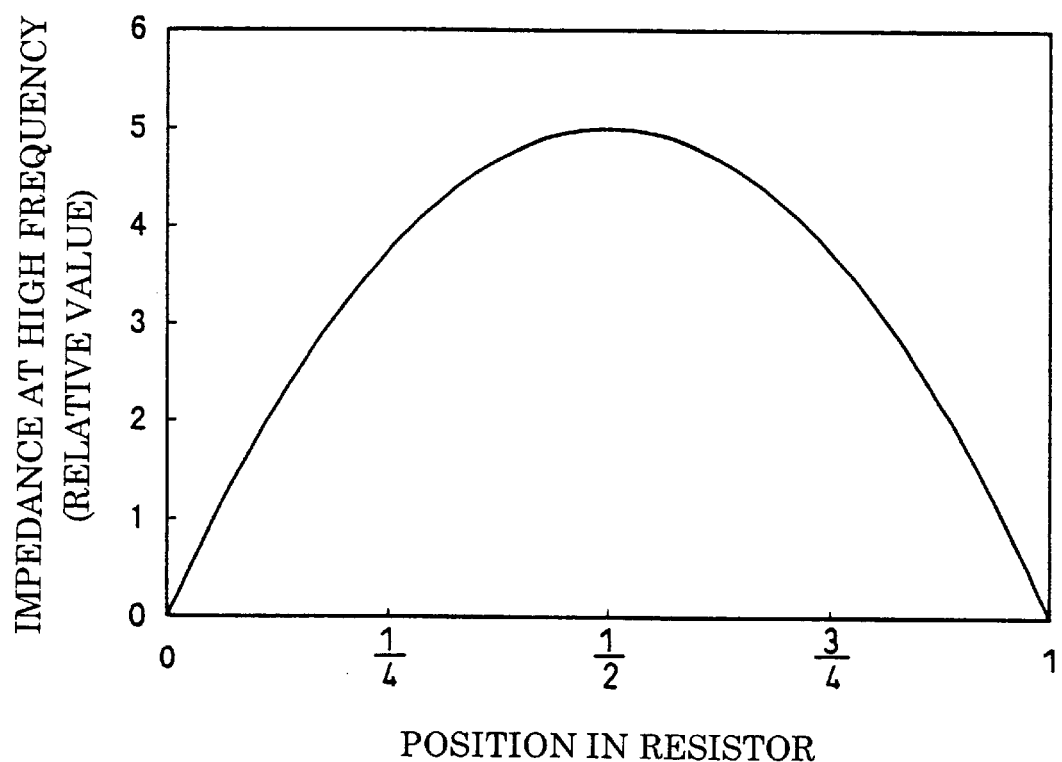
FIG. 5 is a graphical representation showing relationship between positions of output terminals and impedances of the output terminals in a high frequency range in the conventional voltage dividing circuit provided with no capacitive element 38.
Figure 6:
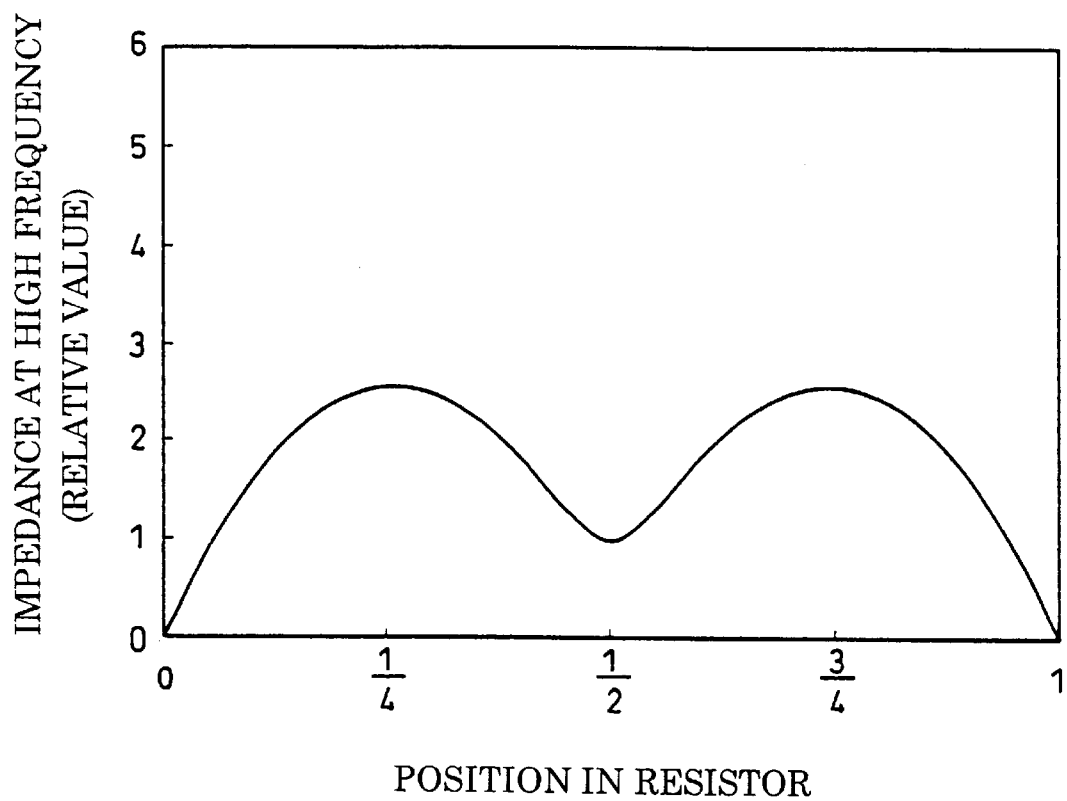
FIG. 6 is a graphical representation showing relationship between positions of output terminals and impedances of the output terminals in a high frequency range in the conventional voltage dividing circuit provided with the capacitive element 38.
Figure 7:
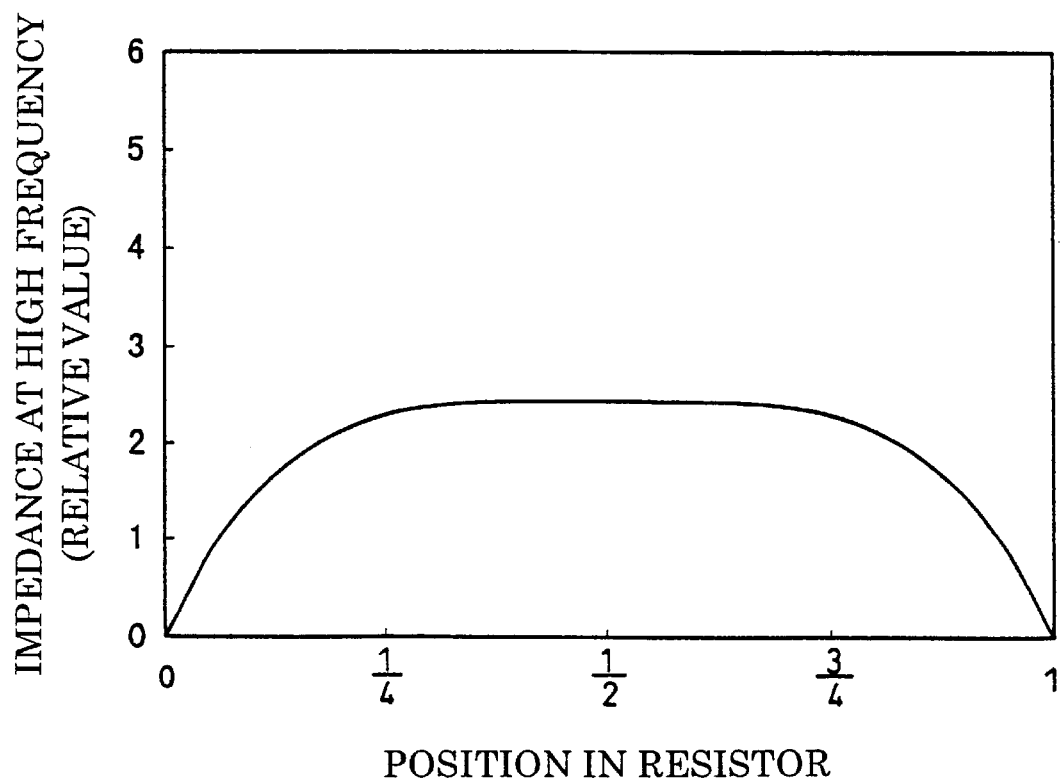
FIG. 7 is a graphical representation showing relationship between positions of output terminals and impedances of the output terminals in a high frequency range in the voltage dividing circuit according to the present invention.

FIG. 4 shows the third embodiment of the voltage dividing resistor 53 according to the present invention. In this embodiment, a counterpart of the capacitive elements in the second embodiment is provided by interposing dielectric 25 between an island 27 prepared by doping a semiconductor substrate 26 and a polycrystalline silicon thin film as resistor 22. The resistor 22 is connected to aluminum output electrodes 24 disposed in holes formed in a silicon oxide coating as insulator 23. Holes are formed in insulator 21 and the insulator 23, and aluminum electrodes are disposed therein to provide capacitive element electrodes 28. Each of the capacitive element electrodes 28 is connected to the earth voltage or a low impedance quasi-earth voltage via aluminum wiring wires. The dielectric 25 between the island 27 and the resistor 22 is in the form of a silicon nitride film having a thickness smaller than those of the insulator 21 and the insulator 23.

It is to be noted that the present invention is by no means restricted to the above-described embodiments. For example, the resistance element as the resistor may be a thin film of a metal such as nichrome. The dielectric and the insulator may be made of the same material and have the same thickness and be formed simultaneously. This leads to simplified production process.

By the use of the voltage dividing resistor as described above which comprises a resistance element compositely provided with the at least one capacitive element, a space necessary for disposing each capacitive element can be made in an area overlapping the resistance element. Accordingly, increase in a cost of a chip is suppressed as compared with conventional means. Further, since the capacitive element extends or the capacitive elements are distributed through the resistance element, no substantial undulation of impedance in a high frequency range, such as that found in conventional means is caused. By virtue of this, flat-top characteristics of impedance is attained.

When the resistance element is a thin film of a metal or the like, a back gate effect which occurs in a doped resistor can be prevented. This leads to improved top-flatness of comparative reference voltages.

According to the embodiment where the capacitive element is provided by interposing the dielectric between the resistance element and the semiconductor substrate, the capacitive element can also be provided in areas corresponding to those in which the electrodes of the resistance element are located and thus which cannot be used for providing capacitive elements in the other embodiments. By virtue of this, a larger capacity can be obtained. When a material having a high specific inductive capacity is used as the dielectric in the thus constituted capacitive element, a further increased capacity can be obtained.

What is claimed is:

1. A voltage dividing resistor comprising:

an input terminal;

a resistance element formed on a substrate for dividing a voltage inputted from the input terminal;

a plurality of output terminals for outputting the divided voltages;

a dielectric material formed on the surface of said resistance element opposing to said substrate; and at least one capacity electrode formed on the surface of said dielectric material opposing to said resistance element;

wherein a capacitive element is formed so that said dielectric material is interposed between said resistance element and said capacity electrode.

2. The voltage dividing resistor according to claim 1, wherein said substrate is a semiconductor substrate and said resistance element is formed by doping impurities into a portion of the surface of the substrate.

3. The voltage dividing resistor according to claim 1, wherein said substrate is formed of an insulator and said resistance element is a thin film coated on said substrate.

4. A voltage dividing resistor, comprising:

an input terminal;

a resistance element formed on a substrate for dividing voltage input from said input terminal;

an insulator layer having a plurality of openings where said resistance element is not coated, and being formed on a surface of the substrate such that said resistance element is partially coated with the insulator layer;

output electrodes in contact with said resistance element, and formed in some of said openings formed on said insulator layer;

dielectric materials in contact with said resistance element and formed in other some of the openings out of said plurality of openings formed on said insulator layer;

a plurality of output terminals, each connected to corresponding ones of said output electrodes for outputting the divided voltages; and a capacity electrode formed in contact with said insulator layer;

wherein a capacitive element is formed so that it is interposed between said resistance element and said capacity electrode.

5. The voltage dividing resistor according to claim 4, wherein said substrate is a p-type semiconductor substrate and said resistance element is formed by doping n-type impurities into a portion of the surface of said p-type semiconductor substrate.

6. The voltage dividing resistor according to claim 4, wherein said substrate is formed of insulator and said resistance element is formed as an impurity-doped polycrystalline film on the surface.

7. The voltage dividing resistor according to 4, wherein said plurality of openings formed on said insulator layer are formed in spaced-apart relationship along the longitudinal direction of said resistance element.

8. The voltage dividing resistor of claim 7, wherein said output electrodes, and said dielectric materials and capacity electrodes are disposed in adjacent relation in ones of said plurality of openings.

9. The voltage dividing resistor according to claim 4, wherein said plurality of openings formed on said insulator layer are formed as perforated holes in said insulator layer.

10. The voltage dividing resistor according to claim 4, wherein said dielectric materials have a thickness less than that of said insulator layer.

11. The voltage dividing resistor according to claim 4, wherein said dielectric material has a specific inductive capacity that is greater than that of said insulator layer.

12. The voltage dividing resistor according to claim 4, wherein said output electrodes and said capacity electrode are composed of aluminum.

13. The voltage dividing resistor according to claim 4, wherein said insulator layer is a $SiO_2$ layer, and wherein said dielectric materials are formed of SiN or of a nichrome metal film.

14. The voltage dividing resistor according to claim 1, wherein said capacity electrode, dielectric material and resistance element are configured to form an integrated capacitive element.

15. The voltage dividing resistor according to claim 4, wherein said capacity electrode, dielectric material and resistance element are configured to form an integrated capacitive element.

16. The voltage dividing resistor according to claim 1,
wherein the input terminal is connected to a reference voltage, and
wherein at least one capacity electrode is connected to ground voltage or a low impedance potential that is nearly equal to the ground voltage.

17. The voltage dividing resistor according to claim 4,
wherein the input terminal is connected to a reference voltage, and
wherein at least one capacity electrode is connected to ground voltage or a low impedance potential that is nearly equal to the ground voltage.

* * * * *